(12) United States Patent
Chung

(10) Patent No.: US 7,527,228 B2
(45) Date of Patent: May 5, 2009

(54) SUPPORTING BASE

(75) Inventor: Ming-Tsai Chung, Taipei (TW)

(73) Assignee: D-Link Corporation, Taipei (TW)

( * ) Notice: Subject to any disclaimer, the term of this patent is extended or adjusted under 35 U.S.C. 154(b) by 0 days.

(21) Appl. No.: 11/437,746

(22) Filed: May 22, 2006

(65) Prior Publication Data
US 2007/0272821 A1      Nov. 29, 2007

(51) Int. Cl.
*A47G 23/00* (2006.01)
(52) U.S. Cl. .................. 248/154; 248/346.01; 248/918
(58) Field of Classification Search ................. 248/154, 248/316.8, 918, 346.01, 346.07, 676
See application file for complete search history.

(56) References Cited

U.S. PATENT DOCUMENTS

| | | | | |
|---|---|---|---|---|
| 4,874,099 A | * | 10/1989 | Arnott et al. | 211/50 |
| 5,295,648 A | * | 3/1994 | Hames | 248/149 |
| 5,397,081 A | * | 3/1995 | Landry et al. | 248/346.5 |
| 5,903,645 A | * | 5/1999 | Tsay | 379/455 |
| 6,364,278 B1 | * | 4/2002 | Lin et al. | 248/676 |
| 6,382,580 B1 | * | 5/2002 | Wisniewski | 248/316.4 |
| 6,805,327 B1 | * | 10/2004 | Shen | 248/346.07 |
| 6,923,414 B2 | * | 8/2005 | Shida et al. | 248/346.07 |

* cited by examiner

*Primary Examiner*—J. Allen Shriver
*Assistant Examiner*—Steven Marsh
(74) *Attorney, Agent, or Firm*—Bacon & Thomas, PLLC

(57) ABSTRACT

A supporting base includes a base, a first supporting arm and a second supporting arm, wherein the supporting arms are installed on a surface of the base, and an object is clamped and mounted between the supporting arms, and a first gap is maintained at a portion of the connecting edge between the first supporting arm and the base, and a second gap corresponding to the first gap is maintained at a portion of the connecting edge between the second supporting arm and the base, so that the gaps can be used for appropriately reducing the strength between the supporting arms and the base and skillfully controlling the coefficient of friction between the supporting arms and the object, so as to securely install the object onto the supporting base without damaging the appearance or surface of the object.

5 Claims, 3 Drawing Sheets

SUPPORTING BASE

FIELD OF THE INVENTION

The present invention relates to a supporting base, and more particularly to a supporting base that can securely install an object onto the supporting base without damaging the appearance or surface of the object.

BACKGROUND OF THE INVENTION

At present, information and knowledge are booming in our society, and thus information exchanges and communications between people become increasingly important. Since the networking era has arrived, networking and telecommunication technologies including mobile communications and wireless communications are developed rapidly and extended extensively in different areas of our life, and significant changes have occurred in our way of using electronic devices. For example, a wireless LAN is a new communication method, not only satisfying the requirements of our wireless communications, but also providing the functions for other leisure recreations and information compilations, and thus more and more people are using wireless LAN related devices now. Particularly, different wireless LAN related devices are introduced to the market, and these devices have become an important tool for our work and life.

Compared with the traditional cabled LAN, the wireless LAN has many advantages as described below. Firstly, users do not have to worry about the wiring problem or waste much time on the installation and construction of the network. Users just need to use an electronic device with a wireless LAN device for logging on the network within the range of the wireless network signal emission. If a user uses a notebook computer for connecting to the network, the user is no longer limited by the cable, and can freely change the location of using the computer and network anytime. Regardless of being at home or going out, a user can continue using the network, and thus the wireless LAN has become very popular and welcome by many users. To cope with the market requirements, various different high-performance multi-functional wireless LAN related devices are introduced to the market continuously.

Most of the general wireless LAN devices include a casing, and the casing contains a circuit board and various different electronic components are provided for the operation of the wireless network device. To prevent a large amount of hot air produced during the operation of these electronic components, the casing usually comes with a plurality of heat dissipating holes. To secure the wireless network device onto a tabletop or other fixed object, a fixed base is provided, such that the wireless network device can be installed at an appropriate position through the fixed base, and users can use the wireless network device to contact with the outside anytime and anywhere.

However, the stability of the traditional fixed bases is not as good, when the fixed bas is combined with the wireless network device. Since the fixed base is not very stable and easily falls off, therefore the fixed base and the wireless network device are loosely combined, and the wireless network device cannot be erected on the tabletop but will be tilted to an angle. The wireless network device falls easily due to the unstable center of gravity, or the wireless network device may even be damaged. To overcome the foregoing shortcomings, some manufacturers improve the fixed base by reinforcing the strength and the stability of the fixed base, so as to securely clamp the wireless network device. Although the problem of the wireless network device falling due to the unstable center of gravity can be solved, the strength and clamping force of the fixed base is excessively large, and thus the surface of the wireless network device may be damaged easily that will greatly reduce the consumer's purchasing willingness. Therefore, finding a way of increasing the clamping force of the fixed base without damaging the surface of the wireless network device not only solves the foregoing problems, but also attracts extensive consumers to purchase the product.

SUMMARY OF THE INVENTION

In view of the shortcomings of the prior art, the inventor of the present invention based on years of experience to conduct extensive researches and experiments, and finally designed and developed a supporting base in accordance with the present invention to overcome the shortcomings of the prior art.

Therefore, it is a primary objective of the present invention to provide a supporting base, comprising a base, a first supporting arm and a second supporting arm, wherein the supporting arms are installed on a surface of the base, and an object is clamped and mounted between the supporting arms, and a first gap is maintained at a portion of the connecting edge between the first supporting arm and the base, and a second gap corresponding to the first gap is maintained at a portion of the connecting edge between the second supporting arm and the base, so that the gaps can be used for appropriately reducing the strength between the supporting arms and the base and skillfully controlling the coefficient of friction between the supporting arms and the object, so as to securely install the object onto the supporting base without damaging the appearance or surface of the object.

Another objective of the present invention is to provide a better flexibility for propping open the supporting arms more easily, and the supporting arms are connected across the base, so as to form a bent portion between both ends of the supporting arms. Further, a sunken portion is disposed on a side facing the supporting arms and at a position proximate to the connecting position of the base, and the sunken portion includes a first fixing element disposed at an end away from the base for connecting a second fixing element disposed on the object, so that the sunken portion provides a better flexibility for the supporting arms to be propped open when the object is installed between the supporting arms, and the object can be securely installed onto the supporting base.

DETAILED DESCRIPTION OF THE PREFERRED EMBODIMENTS

Figure 1:
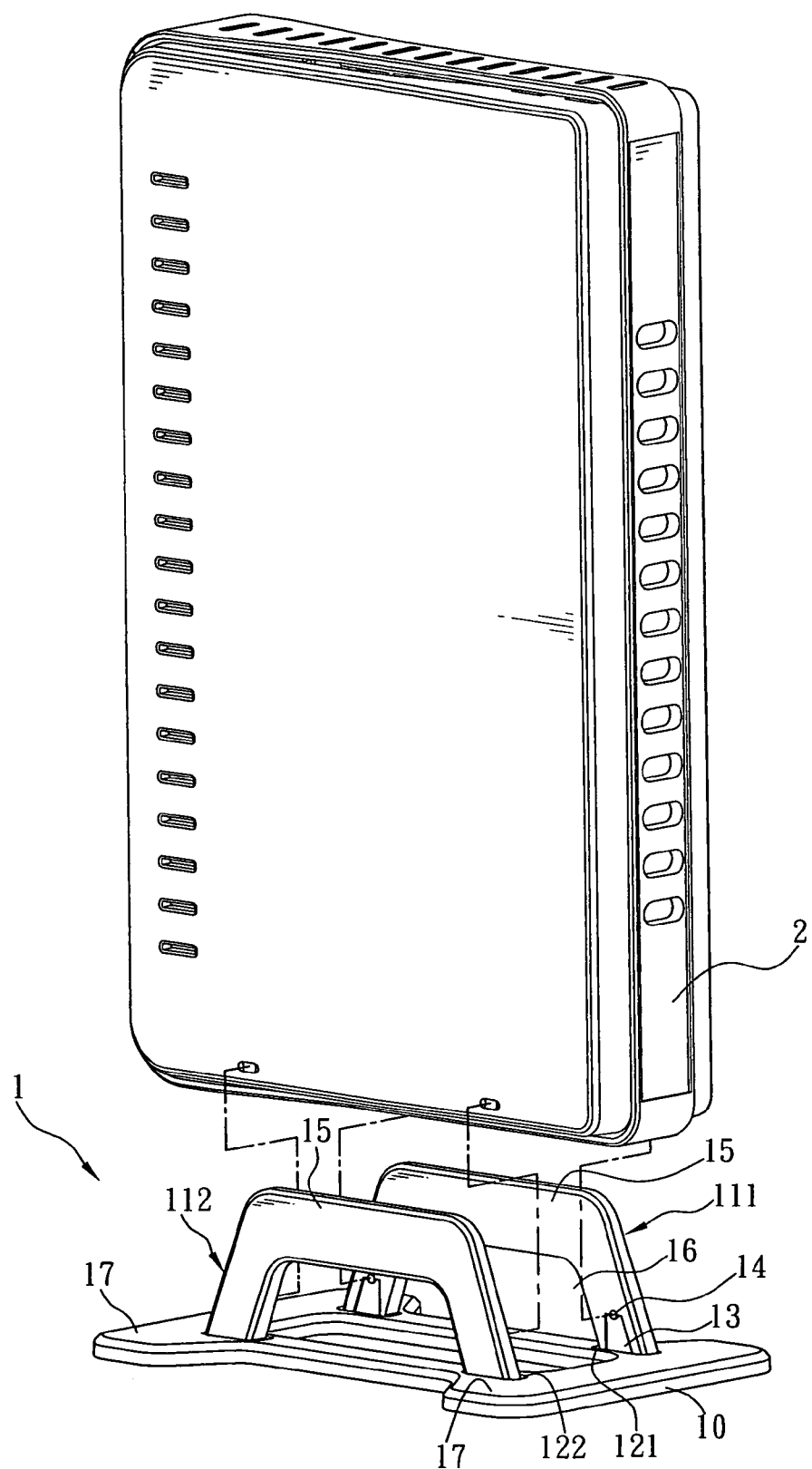
FIG. 1 is a perspective view of a supporting base of the present invention.
Figure 2:
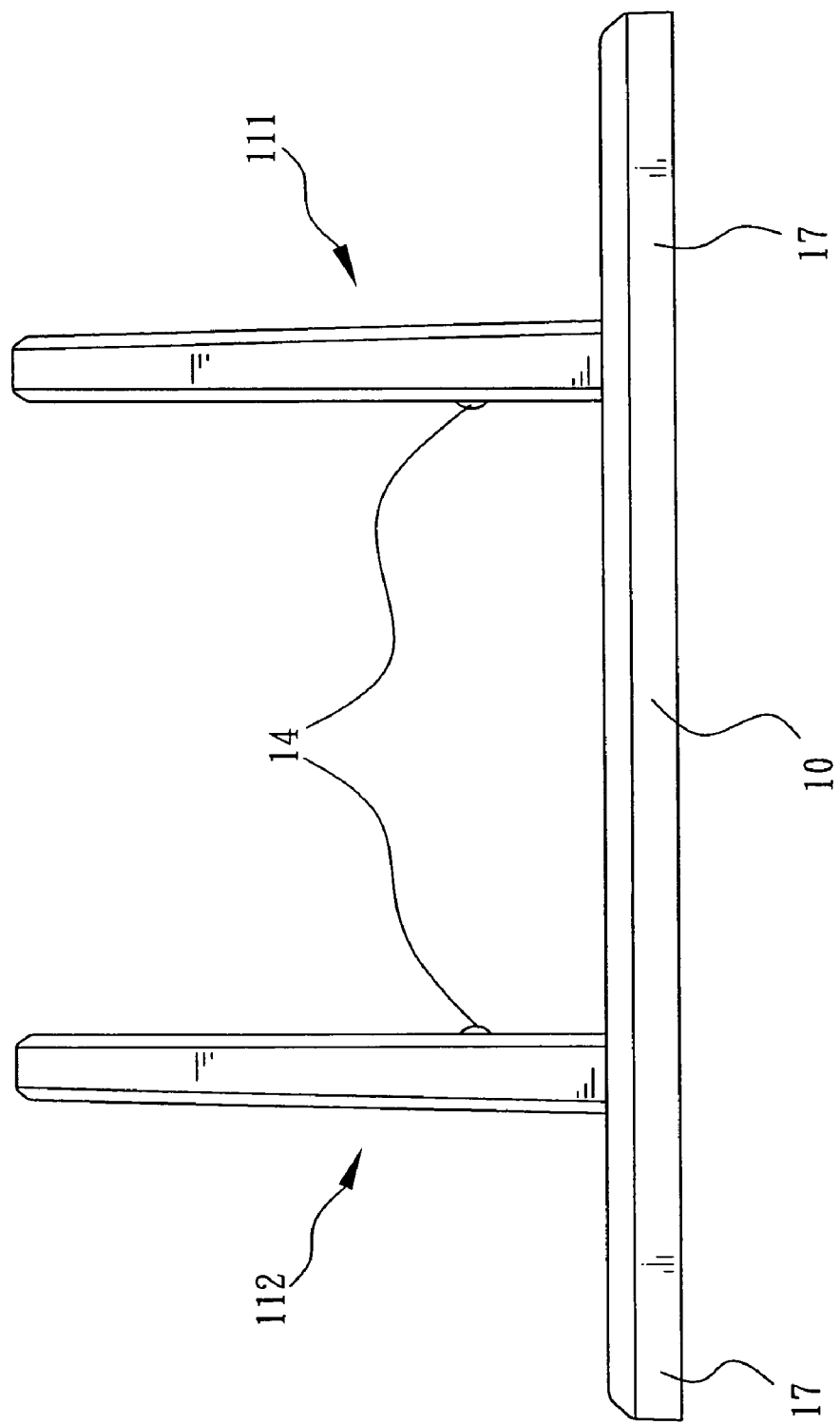
FIG. 2 is a side view of a supporting base of the present invention.
Figure 3:
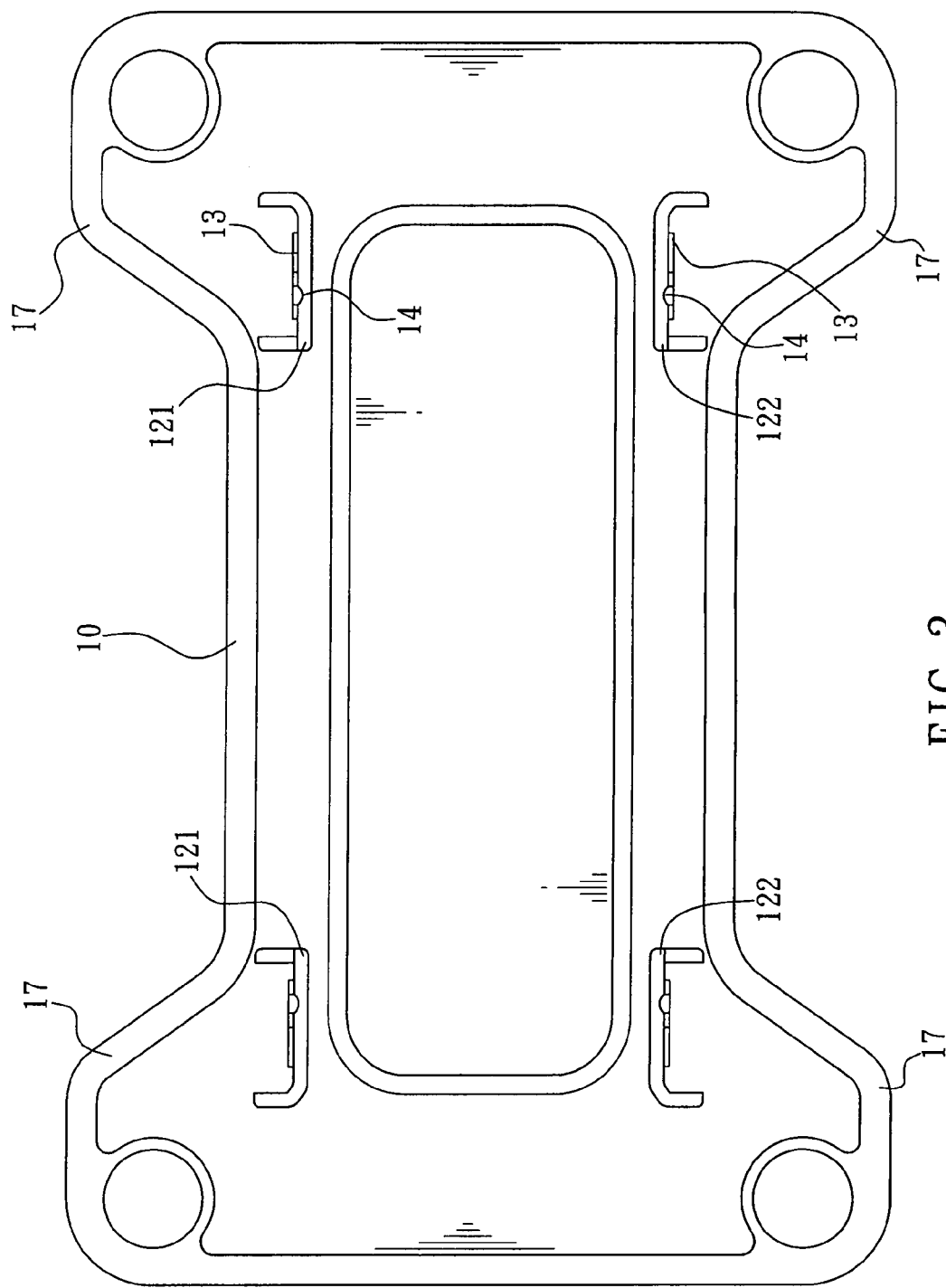
FIG. 3 is bottom view of a supporting base of the present invention.

Referring to FIGS. 1 to 3 for a supporting base of the present invention, the supporting base comprises a base 10, a first supporting arm 111 and a second supporting arm 112 are disposed on a corresponding side of the base 10, and the first supporting arm 111 maintains a first gap 121 from a portion of the connecting edge of the base 10, and the second supporting arm 112 maintains a second gap 122 corresponding to the first gap 121 from a portion of the connecting edge of the base 10.

If an object 2 is placed between the supporting arms, the supporting arms 111, 112 will clamp the object 2, and thus appropriately reducing the strength between the supporting arms 111, 112 and the base 10 to skillfully control the coefficient of friction between the supporting arms 111, 112 and the object 2, and the object 2 can be securely installed onto the supporting base 1 without damaging the appearance and the surface of the object 2.

Referring to FIGS. 1 and 2 for a preferred embodiment of the present invention, a sunken portion 13 is disposed on a corresponding side facing the supporting arms 111, 112 and at a position proximate to the connection of the base 10, and the sunken portion 13 includes a first fixing element 14 disposed at an end away from the base 10 for connecting a second fixing element disposed on the object 2. The sunken portion 13 provides a better flexibility for the supporting arms 111, 112 to be propped open, when the object 2 is placed between the supporting arms 111, 112, and thus the first fixing element 14 can securely place the object 2 onto the supporting base 1.

Referring to FIG. 3 for a preferred embodiment of the present invention, an end of the gap 121, 122 is disposed on a side of the supporting arms 111, 112 and the other end of the gap 121, 122 is extended from a side facing the supporting arms 111, 112 to another side of the supporting arms 111, 112, such that the shape of the gaps 121, 122 is substantially in an inverted U-shape. If the object 2 is placed between the supporting arms 111, 112, the gaps 121, 122 can pull and prop open the supporting arms 111, 112 easily and thus giving a better flexibility for the supporting arms 111, 112.

In the preferred embodiment as illustrated in FIG. 1, the supporting arms 111, 112 are coupled across the base 10, and a bent portion 15 is formed between both ends of the supporting arms 111, 112. With the bent portion 15, an opening is formed between each supporting arm 111, 112 and the base 10, and the supporting arms 111, 112 are substantially in an inverted U-shape. If the object 2 is placed between the supporting arms 111, 112, a better flexibility will be provided for propping the supporting arms 111, 112 open more easily. Such arrangement not only prevents damages to the surface of the object 2, but also provides a larger clamping force for clamping the object 2.

In the preferred embodiment as illustrated in FIG. 1, the edges of the base 10 includes a plurality of protruding member 17 extended outwardly from the base 10 for placing the object 2 more securely on the supporting base 1 without turning over the object 2, and the extended protruding members 17 can increase the contact area between the supporting base 1 and a plane for placing the supporting base 1, and thus it is not necessary to use the base 10 having a large volume, and the extended protruding members 17 can effectively prevent the object 2 from being turned over or tilted due to the unstable center of gravity.

In the preferred embodiment as illustrated in FIG. 1, the width of the sunken portion 13 at an end proximate to the base 10 ranges from the width of each supporting arm 111, 112 to the width of the sunken portion 13 at an end away from the base 10, and the shape of the sunken portions 13 are substantially in the shape of a trapezium. With the sunken portions 13, a portion of the thickness of the supporting arms 111, 112 can be decreased appropriately to provide a better flexibility for propping open the supporting arms 111, 112 more easily. The coefficient of friction between the first fixing element 14 of the supporting arms 111, 112 and the object 2 can be controlled skillfully to adjust the tightness between the supporting base 1 and the object 2, so that the object 2 can be secured onto the supporting base 1 and the appearance and surface of the object 2 can be prevented from being damaged.

In the preferred embodiment as shown in FIGS. 1 and 2, the first fixing element 14 could be a protruding member or a groove for working together with the second fixing element to secure the object 2 onto the supporting base 1.

While the invention has been described by means of a specific embodiment, numerous modifications and variations could be made thereto by those skilled in the art without departing from the scope and spirit of the invention set forth in the claims.

What is claimed is:

1. A supporting base, comprising:
   a base;
   a first supporting arm, disposed on a surface of said base and maintaining a first gap from an edge of said base;
   a second supporting arm, disposed on a surface of said base and at a position facing with said first supporting arm and maintaining a second gap from the edge of said base for placing an object between said first and second supporting arms;
   wherein each of said supporting arms has two ends, each of the two ends coupled onto said base, and a bent portion is formed between said both ends of each of said supporting arms, and an opening is formed between said each supporting arm and said base; and
   wherein said first and second gaps are disposed between said first supporting arm and said second supporting arm; each of said supporting arm includes a sunken portion disposed on a surface facing with each other and at a position proximate to said base, and a first fixing element disposed at an end away from said base for coupling a second fixing element disposed on said object; each of said gaps has an end disposed on a lateral side of said corresponding supporting arm and extended through said surface of said corresponding supporting arm to the other lateral side of said corresponding supporting arm, and is substantially U-shape.

2. The supporting base of claim 1, wherein said base at its edge includes a plurality of extended protruding members extended outwardly from said base.

3. The supporting base of claim 2, wherein said sunken portion at an end proximate to said base has a width ranging between the width of said supporting arm and the width of the other end of said sunken portion away from said base.

4. The supporting base of claim 2, wherein said sunken portion is substantially in a trapezium shape.

5. The supporting base of claim 3, wherein said first or second supporting arm is substantially in an inverted U-shape.

* * * * *